United States Patent
Bilhan et al.

(10) Patent No.: US 12,476,636 B2
(45) Date of Patent: *Nov. 18, 2025

(54) STRESS REDUCTION ON STACKED TRANSISTOR CIRCUITS

(71) Applicant: TEXAS INSTRUMENTS INCORPORATED, Dallas, TX (US)

(72) Inventors: Erkan Bilhan, Dallas, TX (US); Francisco A. Cano, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/516,256

(22) Filed: Nov. 21, 2023

(65) Prior Publication Data

US 2024/0088896 A1    Mar. 14, 2024

Related U.S. Application Data

(60) Division of application No. 16/378,742, filed on Apr. 9, 2019, now Pat. No. 11,831,309, which is a continuation-in-part of application No. 16/262,327, filed on Jan. 30, 2019, now Pat. No. 11,626,875.

(60) Provisional application No. 62/795,461, filed on Jan. 22, 2019, provisional application No. 62/786,507, filed on Dec. 30, 2018, provisional application No. 62/660,593, filed on Apr. 20, 2018.

(51) Int. Cl.
*H03K 19/003* (2006.01)
*H03K 3/356* (2006.01)
*H03K 19/20* (2006.01)

(52) U.S. Cl.
CPC . *H03K 19/00315* (2013.01); *H03K 3/356113* (2013.01); *H03K 19/20* (2013.01)

(58) Field of Classification Search
CPC ............. H03K 19/00315; H03K 19/20; H03K 19/0013; H03K 19/018521; H03K 19/018528; H03K 3/356113
See application file for complete search history.

(56) References Cited

U.S. PATENT DOCUMENTS

| 4,801,826 | A | * | 1/1989 | Cornelissen ... H03K 19/018521 326/88 |
| 4,810,969 | A | | 3/1989 | Fulkerson |
| 4,999,529 | A | | 3/1991 | Morgan et al. |

(Continued)

OTHER PUBLICATIONS

Ali et al., "A 14 Bit 1GS/s RF Sampling Pipelined ADC with Background Calibration", IEEE Journal of Solid-State Circuits, vol. 49, No. 12, Dec. 2014, 11 pages. (Year: 2014).*

*Primary Examiner* — Anh Q Tran
(74) *Attorney, Agent, or Firm* — Carl G. Peterson; Frank D. Cimino (57) ABSTRACT

A circuit includes a first transistor having first and second current terminals and a first control input, and a second transistor having third and fourth current terminals and a second control input. The third current terminal is coupled to the second current terminal at an intermediate node. In some cases, a third transistor is connected to the intermediate node to bias the intermediate rather than letting the intermediate node float. In other cases, a capacitor is connected to the intermediate node to reduce a negative voltage that might otherwise be present on the intermediate node.

20 Claims, 8 Drawing Sheets

(56) References Cited

U.S. PATENT DOCUMENTS

| | | | |
|---|---|---|---|
| 5,148,058 A | 9/1992 | Stewart | |
| 5,198,699 A | 3/1993 | Hashimoto | |
| 5,317,206 A | 5/1994 | Hanibuchi et al. | |
| 5,347,152 A | 9/1994 | Sundaresan | |
| 5,381,051 A | 1/1995 | Morton | |
| 5,426,383 A | 6/1995 | Kumar | |
| 5,514,994 A | 5/1996 | Sawada | |
| 5,550,486 A | 8/1996 | Sweeney | |
| 5,629,638 A | 5/1997 | Kumar | |
| 5,694,061 A | 12/1997 | Morosawa et al. | |
| 5,726,589 A | 3/1998 | Cahill et al. | |
| 5,764,566 A * | 6/1998 | Akamatsu | G11C 11/412 365/189.05 |
| 5,828,236 A | 10/1998 | Zhou | |
| 5,933,050 A | 8/1999 | Akamatsu et al. | |
| 5,949,271 A | 9/1999 | Fujikura | |
| 5,952,851 A | 9/1999 | Yuen | |
| 5,969,542 A * | 10/1999 | Maley | H03K 17/102 326/17 |
| 6,014,042 A * | 1/2000 | Nguyen | H03K 5/26 327/543 |
| 6,016,064 A | 1/2000 | Saeki | |
| 6,118,309 A | 9/2000 | Akamatsu et al. | |
| 6,225,820 B1 | 5/2001 | Kim et al. | |
| 6,239,958 B1 | 5/2001 | Kato et al. | |
| 6,331,787 B1 | 12/2001 | Whitworth et al. | |
| 6,522,323 B1 | 2/2003 | Sasaki et al. | |
| 6,600,354 B2 | 7/2003 | Saeki | |
| 6,975,143 B2 | 12/2005 | Deng | |
| 7,202,863 B2 | 4/2007 | Kimura et al. | |
| 7,239,190 B2 | 7/2007 | Saeki | |
| 7,570,081 B1 | 8/2009 | Harris et al. | |
| 8,111,089 B2 | 2/2012 | Cocchi et al. | |
| 8,400,187 B2 | 3/2013 | Yamazaki et al. | |
| 8,456,402 B2 | 6/2013 | Kimura et al. | |
| 8,674,979 B2 | 3/2014 | Hayakawa | |
| 9,214,475 B2 | 12/2015 | Pappas | |
| 9,466,618 B2 | 10/2016 | Miyake | |
| 9,553,583 B2 | 1/2017 | Yamazaki et al. | |
| 9,742,378 B2 | 8/2017 | Tanada et al. | |
| 10,050,524 B1 | 8/2018 | Rana | |
| 10,297,331 B2 | 5/2019 | Miyake | |
| 11,626,875 B2 | 4/2023 | Bilhan et al. | |
| 11,831,309 B2 | 11/2023 | Bilhan et al. | |
| 2003/0020520 A1 | 1/2003 | Miyake et al. | |
| 2006/0061389 A1 | 3/2006 | Bertin | |
| 2006/0176988 A1 * | 8/2006 | Sohn | H04L 25/03038 375/348 |
| 2008/0116952 A1 | 5/2008 | Kase et al. | |
| 2011/0057685 A1 | 3/2011 | Noguchi | |
| 2011/0316505 A1 | 12/2011 | Shrivastava | |
| 2012/0242370 A1 | 9/2012 | Park et al. | |
| 2013/0214854 A1 | 8/2013 | Abe et al. | |
| 2014/0232432 A1 | 8/2014 | Fish et al. | |
| 2016/0028398 A1 | 1/2016 | Wu et al. | |
| 2016/0232956 A1 | 8/2016 | Ishizu et al. | |
| 2016/0233866 A1 | 8/2016 | Ishizu et al. | |
| 2018/0152187 A1 * | 5/2018 | Yang | H03K 19/018521 |
| 2019/0245526 A1 * | 8/2019 | Satou | H03K 19/018507 |
| 2019/0326909 A1 | 10/2019 | Bilhan et al. | |
| 2019/0326910 A1 | 10/2019 | Bilhan et al. | |
| 2020/0274542 A1 * | 8/2020 | Bhoraskar | H03K 5/2481 |
| 2021/0050778 A1 | 2/2021 | Rana | |
| 2023/0238959 A1 | 7/2023 | Bilhan et al. | |
| 2024/0088896 A1 | 3/2024 | Bilhan et al. | |

* cited by examiner

STRESS REDUCTION ON STACKED TRANSISTOR CIRCUITS

CROSS-REFERENCE TO RELATED APPLICATIONS

The present application is a divisional of U.S. patent application Ser. No. 16/378,742, filed Apr. 9, 2019, currently U.S. Pat. No. 11,831,309 on Nov. 28, 2023, which is a continuation-in-part of U.S. patent application Ser. No. 16/262,327, filed on Jan. 30, 2019 (now U.S. Pat. No. 11,626,875), which claims priority to U.S. Provisional Patent Application No. 62/660,593, filed Apr. 20, 2018; U.S. Provisional Patent Application No. 62/786,507, filed Dec. 30, 2018; and, to U.S. Provisional Patent Application No. 62/795,461, filed Jan. 22, 2019, all of which are hereby incorporated herein by reference in their entirety. This application is related to U.S. patent application Ser. No. 18/131,009, filed Apr. 5, 2023.

BACKGROUND

Many types of circuits include two or more transistors connected in a stacked configuration. In the case of, for example, metal oxide semiconductor (MOS) transistors, the source of one transistor is connected to the drain of the next transistor in the stack. NAND gates, NOR gates, flip-flops often include stacked transistors.

SUMMARY

A circuit includes a first transistor having first and second current terminals and a first control input, and a second transistor having third and fourth current terminals and a third control input. The third current terminal is connected to the second current terminal at an intermediate node and the fourth current terminal connected to a ground node. In some cases, a third transistor is connected to the intermediate node to bias the intermediate rather than letting the intermediate node float. In other cases, a capacitor is connected to the intermediate node to reduce a negative voltage that might otherwise be present on the intermediate node.

BRIEF DESCRIPTION OF THE DRAWINGS

For a detailed description of various examples, reference will now be made to the accompanying drawings in which.

DETAILED DESCRIPTION

In a stacked transistor configuration, the node interconnecting two transistors may float during operation of the circuit containing the stacked transistors. Further, due to parasitic capacitance between a gate and a drain of one of the transistors of the stack, the voltage on the floating node interconnecting the transistors may fall below ground (negative voltage) thereby potentially causing a drain-to-source voltage (VDS) of one of the transistors in the stack to exceed the supply voltage while the gate-to-source voltage (VGS) of the same transistor is greater than zero but below the transistor's threshold voltage (VT). Subjecting a transistor to an elevated VDS (e.g., in excess of the circuit's VDD supply voltage) while also operating the transistor in the sub-threshold region can cause non-conductive stress on the transistor possibly leading to degradation in the performance of the transistor over time and even the transistor's failure.

The described examples address this problem. The examples herein pertain to a transistor stack (two or more serially-connected transistors). Many types of circuits use transistor stacks. Examples of such circuits include NAND gates, NOR gates, flip-flops, and level shifters. In one example, 1.8V n-channel metal oxide semiconductor field effect transistors (NMOS devices) are used.

Figure 1:
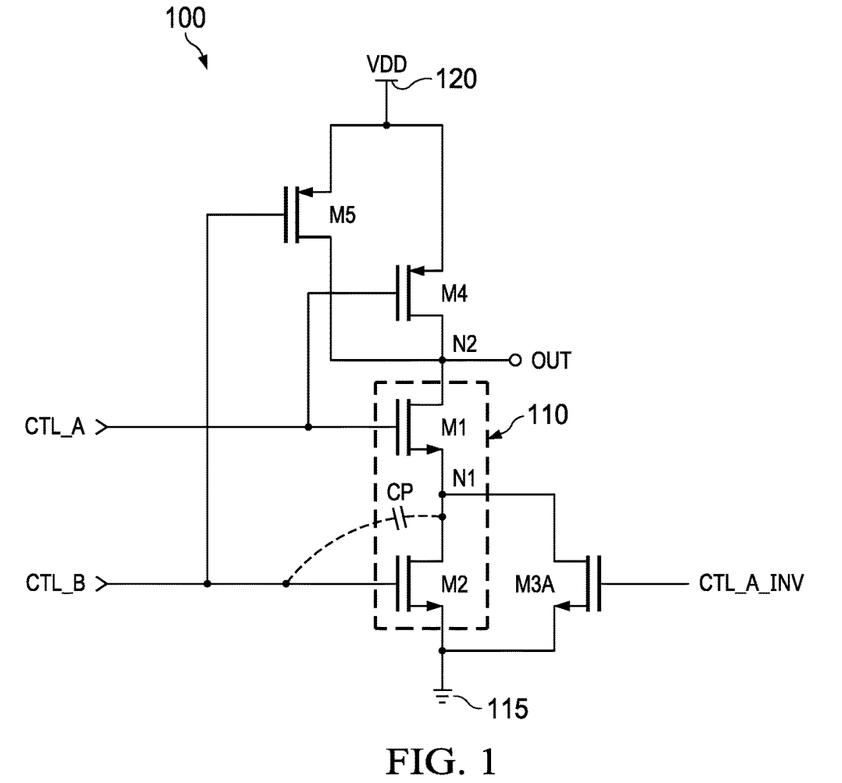
FIG. 1 illustrates an example of a circuit including a transistor stack and a component to provide a direct current (DC) bias to an intermediate node of the transistor stack.

FIG. 1 shows an embodiment of a NAND gate 100 including transistors M1, M2, M3A, M4, and M5. Each transistor M1, M2, M3A, M4, and M5 includes a control input and a pair of current terminals. In the example of FIG. 1, transistors M1 and M2 are n-channel metal oxide semiconductor field effect transistors (NMOS devices) and transistors M3A, M4, and M5 are p-channel metal oxide semiconductor field effect transistors (PMOS devices). As such, the control inputs are the gates of the respective transistors and the current terminals are the drains and sources of the respective transistors. In other implementations, any of the transistors shown in FIG. 1 can be of the opposite doping type from that shown. For example, transistor M1 can be implemented as PMOS device. Further, any or all of the transistors shown in FIG. 1 can be implemented as bipolar junction transistors or other transistor types. As bipolar junction transistors, the control inputs are the bases of the transistors and the current terminals are the emitters and collectors.

Transistors M1 and M2 form a transistor stack 110. The source of transistor M1 is connected to the drain of transistor M2 thereby defining an intermediate node N1. The source of transistor M2 is connected to a ground node 115. The drain of transistor M1 is connected to the drains of transistors M4 and M5 at node N2, and the sources of transistors M4 and M5 are connected to a supply voltage node 120 (VDD).

The gates of transistors M1 and M4 are connected together and receive a control signal CTL_A. The gates of transistors M2 and M5 are connected together and receive a control signal CTL_B. The output (OUT) from NAND gate 100 is the node N2 interconnecting the drains of transistors M1, M4, and M5 as shown. As a NAND gate, the inputs are the control signals CTL_A and CTLB and the output is OUT. When both CTL_A and CTL_B are logic high ("1"), both NMOS transistors M1 and M2 are on and both the PMOS transistors M4 and M5 are off. With both M1 and M2 being on, OUT is pulled low to ground and thus is logic low ("0"). When either or both of CTL_A or CTL_B are low, their respective NMOS transistor M1 or M2 is turned off thereby disconnecting OUT from the ground potential of the ground node 115. Further, when either or both of CTL_A or CTL_B are low, their respective PMOS device M4 or M5 is turned on thereby pulling OUT up to the VDD potential of the power supply node 120. As such, OUT is only low when both CTL_A and CTL_B are low; otherwise OUT is high. The output signal on OUT is thus the logical NAND of CTL_A and CTL_B.

Figure 2:
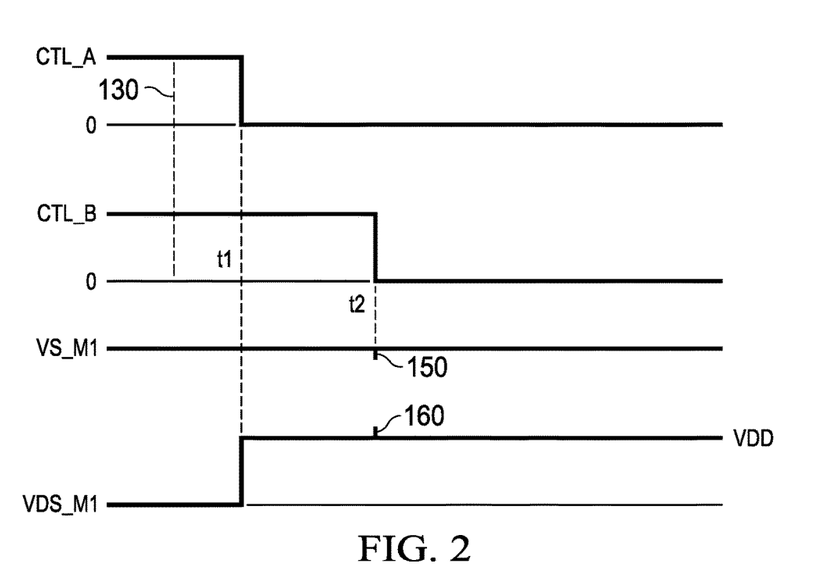
FIG. 2 illustrates waveforms pertaining to the circuit of FIG. 1.

An example of timing diagrams for the operation of NAND gate 100 are shown in FIG. 2 for CTL_A, CTL_B, the source voltage of transistor M1 (VS_M1), and the VDS of transistor M1 (VDS_M1). At 130, both CTL_A and CTL_B are high, which causes both of M1 and M2 to be on. At time t1, CTL_A transitions from high to low, while CTL_B remains high. VS_M1 is low due to transistor M2 to being on and connected to ground. Further, VDS_M1 is low because transistor M1 is on.

At time t2, CTL_B transitions from high to low. Ignoring M3A for the time being, upon CTL_B transitioning from high to low, transistor M2 turns off. As transistor M2 turns off (and assuming M3A is not present in the circuit), intermediate node N1 floats. With N1 floating, parasitic capacitance between the gate and drain of M2 (as shown by parasitic capacitance CP in FIG. 1) causes the voltage on N1 to fall below the ground potential and, if that were to happen, the voltage on the source of transistor M1 decreases below ground and VDS_M1 increases to a voltage above VDD. In this state, transistor M1 is operating in the subthreshold region as its VGS is greater than 0 but less than its VT while its VDS is above VDD thereby causing impairment of the long-term reliability of the circuit.

The inclusion of M3A, however, solves the problem of having a floating intermediate node in transistor stack. The drain of M3A is connected to the intermediate node N1 and the source of M3A is connected to the ground node 115. When M3A is on, intermediate node N1 is biased to ground. The gate of M3A is controlled by a control signal labeled as CTL_A_INV. CTL_A_INV is of the opposite polarity as CTL_A. In one example, an inverter can be included to invert CTL_A to produce CTL_A_INV. When M1 is off due to CTL_A being low, transistor M3A is on due to CTL_A_ INV being high. M3A being on thereby imposes a direct current (DC) bias voltage on N1 (ground in this example). By DC biasing the intermediate node N1 at the ground potential, the reduction in voltage on N1 (VS_M1) due to transistor M2 turning off and the parasitic gate-to-drain capacitance of transistor M2 is significantly less than would be the case absent M3A.

As FIG. 2 show, VS_M1 is at 0V while CTL_B is high (which forces transistor M2 to be on). When CTL_A transitions from high to low at t1, CTL_A_INV transitions from low to high thereby turning on transistor M3A and DC biasing N1 to ground starting at t1. Node N1 remains biased to ground even after CTL_B transitions low at t2 turning transistor M2 off due to the continued operation of transistor M3A in the on state. A small downward momentary drop in VS_M1 may be present as indicated at 150. A small and short duration increase in VDS_M1 is also present as shown at 160 due to decrease in VS_M1 at 150, but the upward blip of VSS_M1 is much smaller in both magnitude and duration than would have been the case had M3A not been present.

The example of FIG. 1 shows a transistor stack including two transistors M1 and M2. The described principles for FIG. 1 and the other figures/examples apply as well to transistor stacks comprising more than two transistors.

Figure 3:
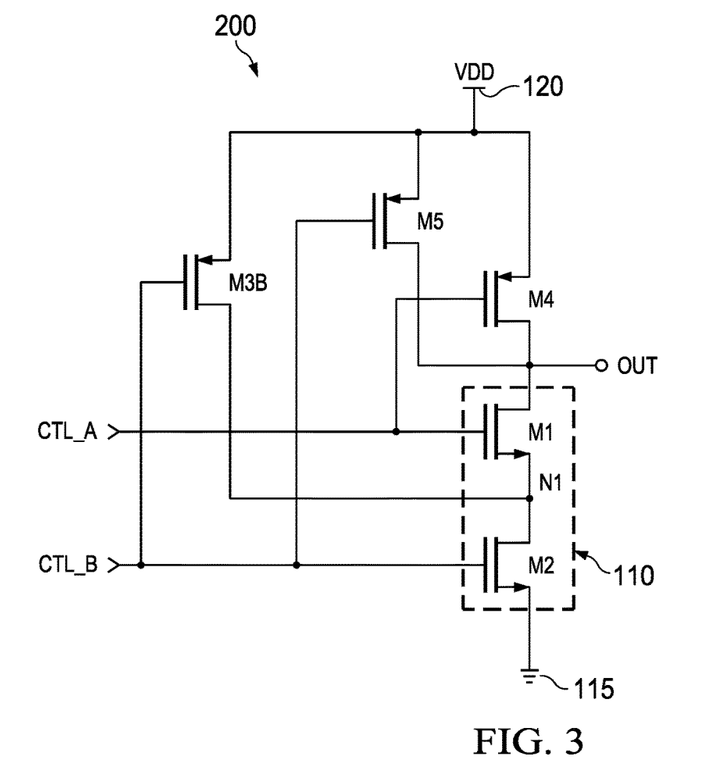
FIG. 3 shows another example of a circuit including a transistor stack and a component to DC bias to an intermediate node of the transistor stack.

FIG. 3 shows an example of a NAND gate 200 including some of the same components (e.g., transistors M1, M2, M4, and M5) as in the example of FIG. 1. The NAND gate 200 of FIG. 3 includes a transistor M3B to impose a DC bias on intermediate node N1. In this example, M3B is a PMOS transistor whose source is connected to the supply voltage node 120 and whose drain is connected to intermediate node N1. The gate of M3B is connected to the gate of M2 and thus is controlled by the same control signal (CTL_B) as M2. An inverter is not used to generate the control signal for M3B. As transistor M2 is an NMOS transistor and transistor M3B is a PMOS transistor, transistor M2 will be on and M3B off when CTL_B is high, and transistor M2 will be off and M3B on when CTL_B is low. Because transistor M3B is connected to VDD, when transistor M2 is caused to transition from on to off, M3B is turned on thereby providing a DC bias on node N1 approximately equal to VDD. This DC bias prevents the voltage on node N1 (VS_M1) from becoming negative.

Figure 4:
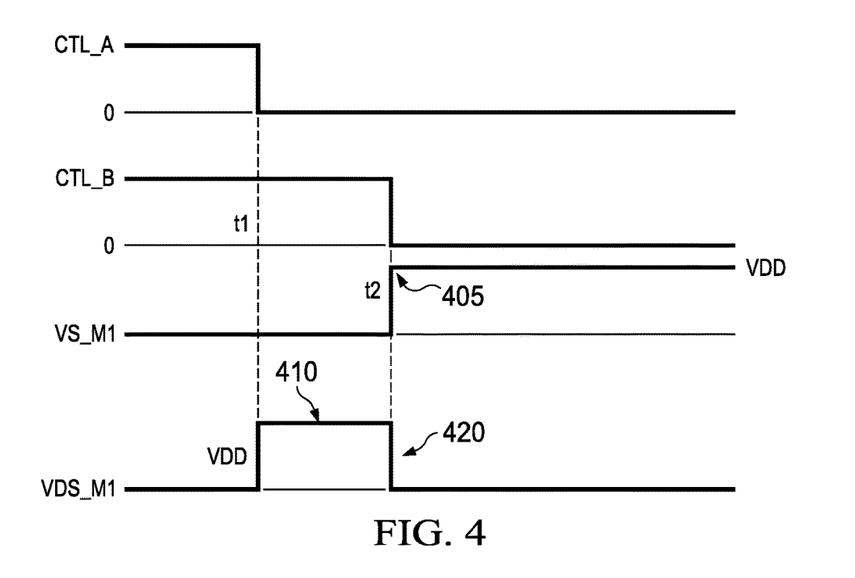
FIG. 4 illustrates waveforms pertaining to the circuit of FIG. 3.

FIG. 4 shows an example of waveforms pertaining to FIG. 3. As in FIG. 2, CTL_A is forced low at time t1 and CTL_B is forced low at time t2. Prior to t1, with both transistors M1 and M2 on, VS_M1 is pulled low to ground. Between t1 and t2, VS_M1 remains low because transistor M2 is still on. When transistor M2 is turned off at t2, transistor M3B is turned on thereby forcing MS_M1 to become high as shown at t2 (405). VDS_M1 is low prior to t1 because M1 is on prior to t1. Once M1 turns off at t1, transistor M4 turns on thereby causing the drain of M1 to become high. With M2 still on between t1 and t2, the source of transistor M1 (voltage on node N1) is low and thus VDS_M1 is high between t1 and t2 as shown at 410. Once transistor M2 also turns off at t2, the source of transistor M1 becomes high due to M3B being on. Transistor M4 continues to be on due to CTL_A being low and the voltage on the drain of M1 remains high. Thus, VDS_M1 drops to zero again at edge 420. The VDS_M1 voltage does not increase above VDD thereby avoiding or at least reducing the problem noted above.

Figure 5:
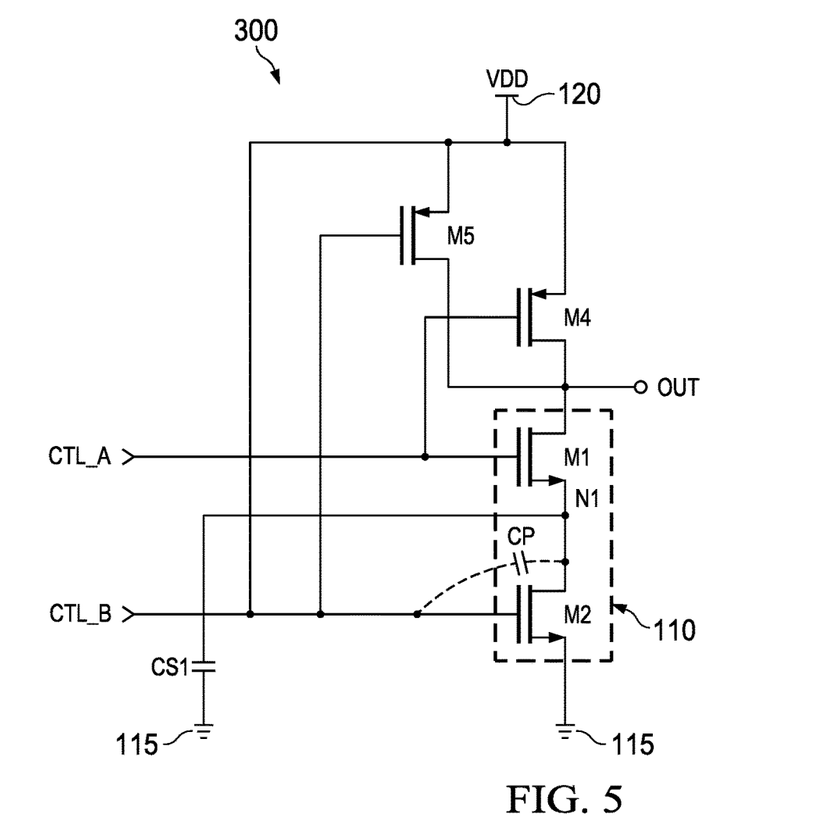
FIG. 5 shows another example of a circuit including a transistor stack and a capacitor connected to an intermediate node of the transistor stack.
Figure 6:
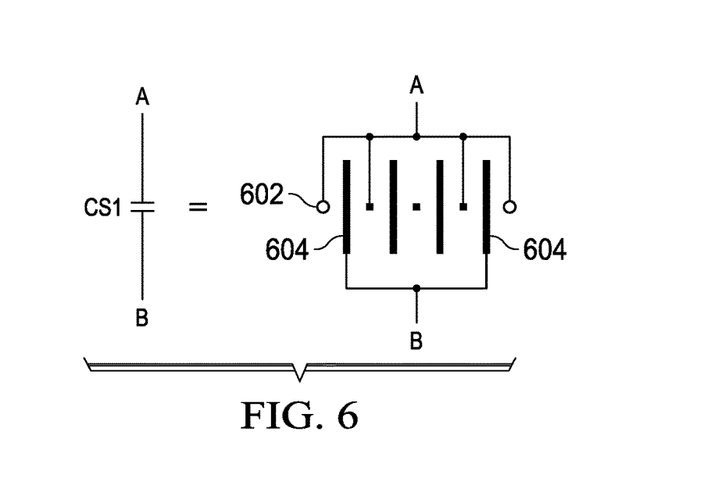
FIG. 6 shows an example implementation of the capacitor.

FIG. 5 shows an example of a NAND gate 300 including some of the same components (e.g., transistors M1, M2, M4, and M5) as in the example of FIG. 1. The NAND gate 300 of FIG. 5 includes a capacitor CS1 connected between intermediate node N1 and ground. CS1 can be implemented as a device capacitor, a MOS transistor whose drain and source are connected together so that the gate is one terminal of the capacitor and the drain/source connection is the other terminal of the capacitor, or any other type of capacitive device. In one example, extra "dummy" transistors may be available on a semiconductor die that can be configured to be capacitor CS1. FIG. 6 shows an example of an implementation of the capacitor (CS1) by utilizing the dummy structures around actual transistor (M2). Gates 604 of the dummy structures connect to ground node 115 (FIG. 5.) and the drain and source connect to node N1 (FIG. 5) shared with M2.

Figure 7:
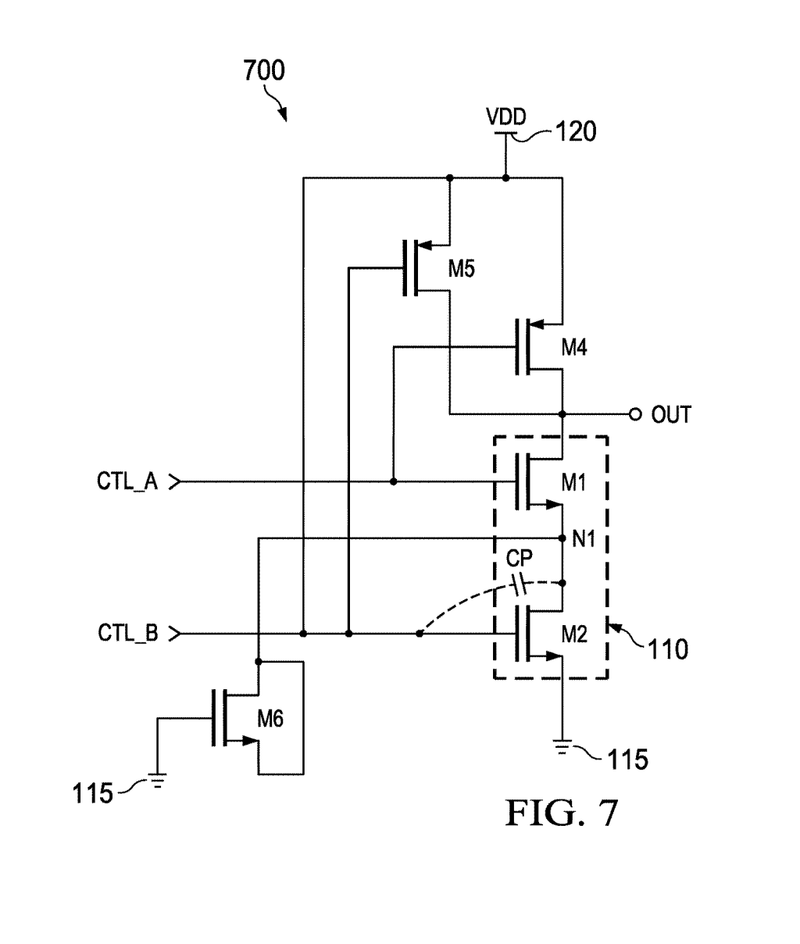
FIG. 7 shows an example of a circuit including a transistor stack and a capacitive device implemented as a transistor connected to an intermediate node of the transistor stack.

FIG. 7 shows an example NAND gate 700, with a transistor M6 implementing a capacitor between the intermediate node N1 and ground. The transistor M6 is illustrated as an NMOS device in this example, whose drain and source are connected together and to the intermediate node N1. Transistor M6 can be implemented as a different type of transistor (e.g., a PMOS transistor). The gate of M6 is connected to the ground node 115. By tying together the drain and source of M6, M6 is usable as a capacitive device.

Figure 8:
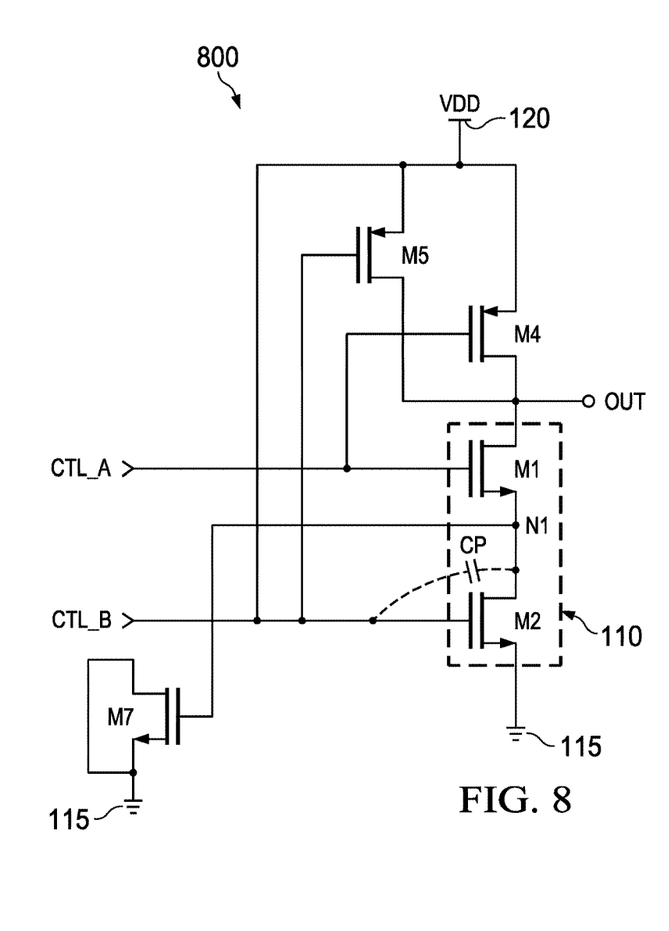
FIG. 8 shows another example of a circuit including a transistor stack and a capacitive device implemented as a transistor connected to an intermediate node of the transistor stack.

FIG. 8 also shows an example NAND gate 800, with transistor M7 implementing the capacitor between the intermediate node N1 and ground. The transistor M7 is illustrated as an NMOS device in this example (but can be a PMOS or other type of transistor), whose drain and source are connected together and to the ground node 115. The gate of M7 is connected to the intermediate node N1. M7 in this example is operative as a capacitive device.

Figure 9:
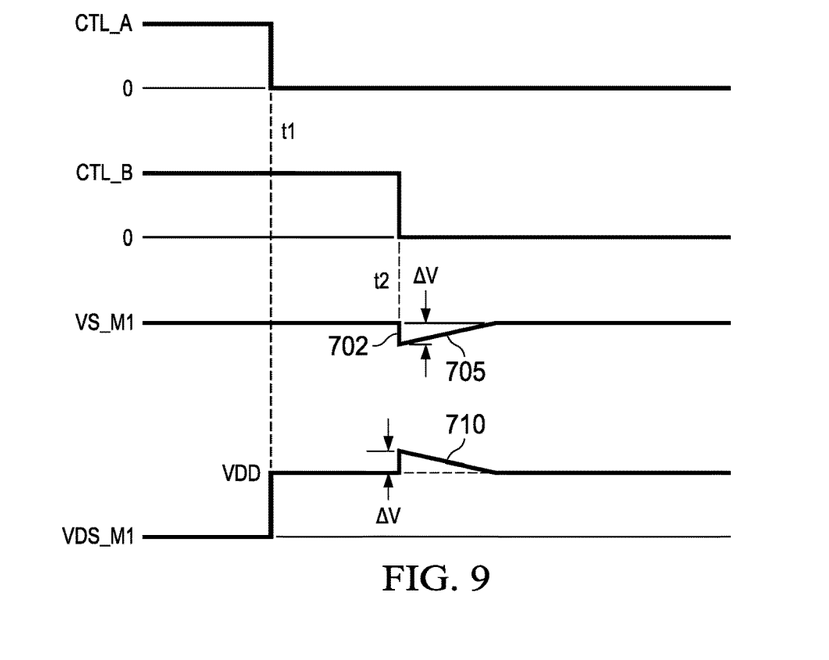
FIG. 9 illustrates waveforms pertaining to the circuit of FIG. 5.

Capacitor CS1 limits the charge coupling from the gate of M2 to the intermediate node N1. The size of capacitor CS1 is application-specific. FIG. 9 shows an example of waveforms pertaining to FIG. 5. As in FIG. 2, CTL_A is forced low at time t1 and CTL_B is forced low at time t2. Prior to t1, with both transistors M1 and M2 on, VS_M1 is pulled low to ground. Between t1 and t2, VS_M1 remains low because transistor M2 is still on. When M2 is turned off at t2, the voltage on node N1 (VS_M1) drops slightly (ΔV) due to the parasitic capacitance CP as shown at 702. However, the drop in VS_M1 voltage is not as large as would be the case without CS1. Negative charge on N1 dissipates through device leakage and VS_M1 then begins to increase as shown at 705. VDS_M1 is zero volts while transistor M1 is on; once transistor M1 turns off and transistor M4 turns on, VDS_M1 increases to VDD as shown at time t1. VDS_M1 remains at VDD until t2 at which time transistor M2 turns off and VS_M1 drops below zero at 702 and charges back up to zero volts at 705 as negative charge dissipates through device leakage. The drain of transistor M1 remains fixed at VDD, but the source of M1 drops and then rises. The drop and then rise of VS_M1 is thus reflected in VDS_M1 as shown at 710. The increase in VDS_M1 above VDD also is ΔV and is less than would be the case absent CS1.

Figure 10:
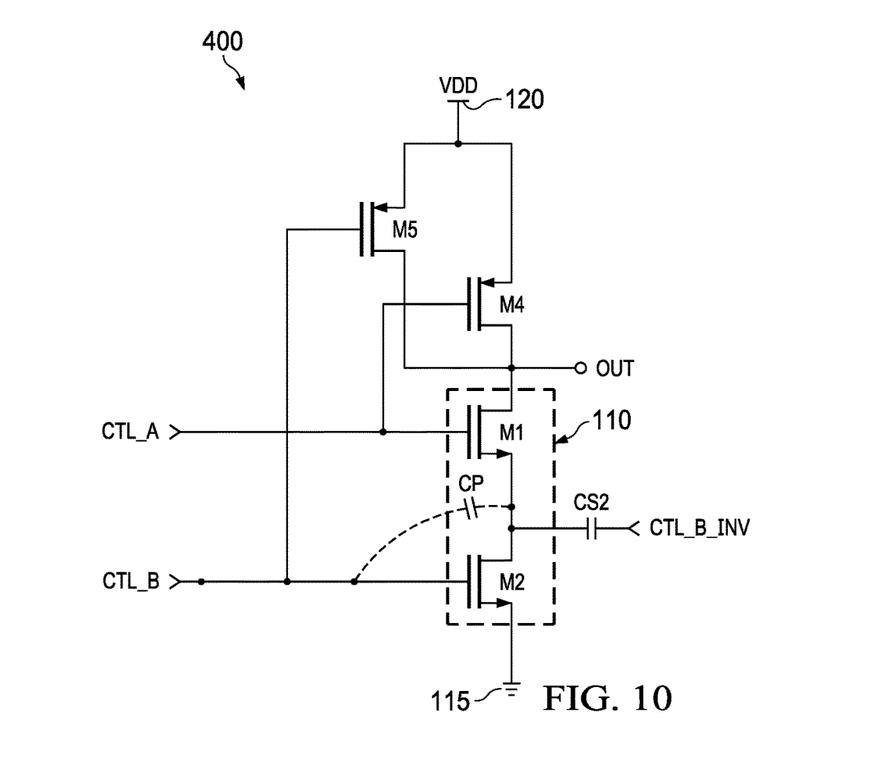
FIG. 10 shows another example of a circuit including a transistor stack and a capacitor connected to an intermediate node of the transistor stack.

FIG. 10 shows an example of a NAND gate 400 including some of the same components (e.g., transistors M1, M2, M4, and M5) as in the example of FIG. 1. The NAND gate 400 of FIG. 10 includes a capacitor CS2 with one terminal being connected to intermediate node N1 and the other terminal receiving a control voltage CTL_B_INV (opposite polarity of CTL_B, generated, for example, by an inverter). CS2 can be implemented as described above regarding CS1. Through capacitor CS2, opposite charge is provided to node N1 from that caused by the parasitic capacitor CP. That is, to a certain degree, capacitor CS2 provides charge balancing on node N1 thereby reducing the large downward drop in voltage on N1 that would otherwise be the case in the absence of CS2. The coupling efficiency is given by Cp/Ctotal, where Ctotal is the total capacitance of the intermediate node N1. In the case of CS1 connected to ground, the coupling efficiency is decreased per Cp/(Cotal+CS1). In the case of CS2 since the opposite terminal of CS2 is also switching between VDD and GND the coupling efficiency is reduced per Cp(Cotal+2*CS2). Thus, the ratio of voltages from without either CS1 or CS2 as compared to inclusion of CS1 or CS2 is, in the case of CS1 Ctotal/(Ctotal+CS1) and in the case of CS2 Ctotal/(Ctotal+2*CS2).

Figure 11:
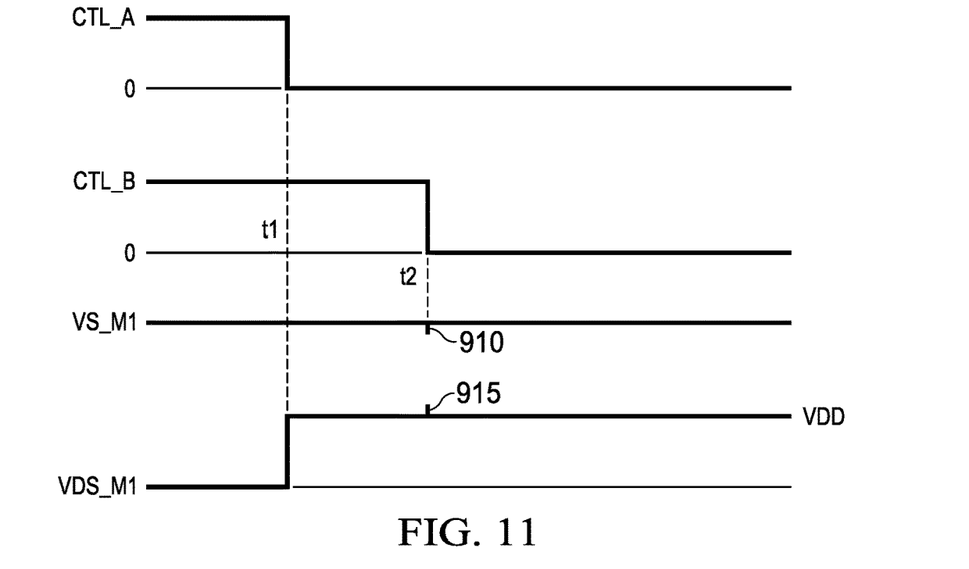
FIG. 11 illustrates waveforms pertaining to the circuit of FIG. 9.

FIG. 11 shows the waveforms pertaining to the operation of the NAND gate 400 of FIG. 10. The waveforms for CTL_A, CTL_B, VS_M1, and VDS_M1 are largely the same as in FIG. 2 and described above. A small drop in VS_M1 may be present as identified at 810 in the waveforms of FIG. 11. A corresponding small increase in VDS_M1 also may be present as shown at 915.

Figure 12:
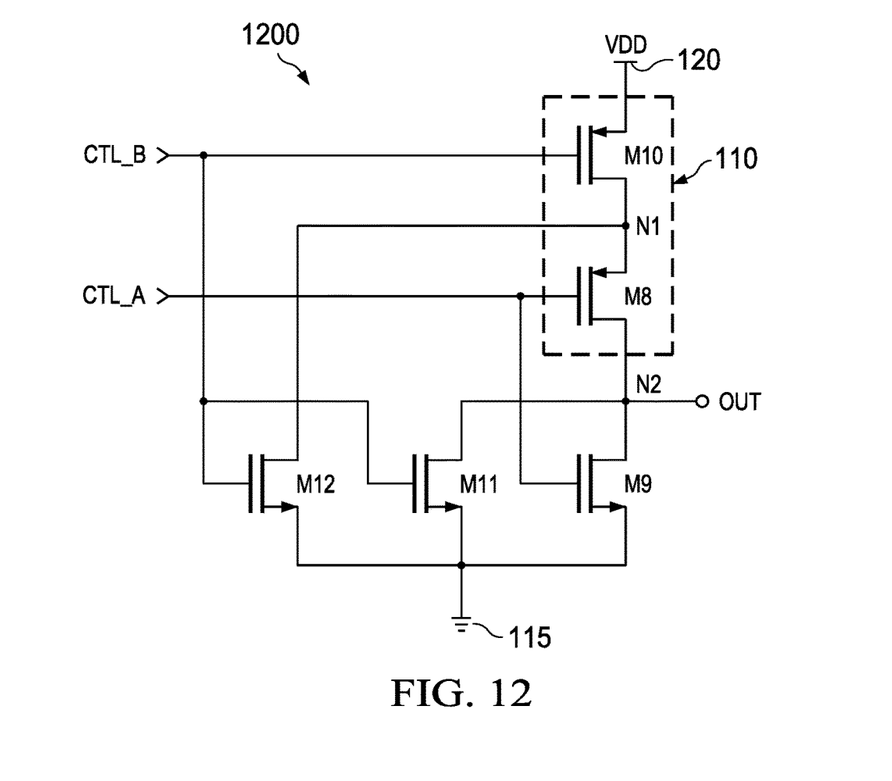
FIG. 12 shows an example of a NOR gate including a transistor stack and a transistor to provide a DC bias to an intermediate node of the transistor stack.

It was explained above that NAND gates, NOR gates, flip-flops, and level shifters typically include stacked transistor configurations. The examples above pertain to a NAND gate. FIG. 12 shows an example implementation of a NOR gate 1200. The NOR gate of FIG. 12 includes PMOS transistors M8 and M10 and NMOS transistors M9, M11, and M12. The transistors M8 and M10 are connected to form a transistor stack. 110. The source of the transistor M8 is connected to the drain of M10 at an intermediate node N1, and the source of transistor M10 is connected to the power supply node 120. The drains of M8 and M9 are connected at node N2, and the sources of M9, M11 and M12 are connected to the ground node 115. The inputs to the NOR gate 1200 include CTL_A and CTL_B. The output (OUT) of the NOR gate 1200 includes the voltage on the node N2. The drain of transistor M11 is connected to the intermediate node N1, and CTL_B drives the gates of transistors M11 and M12. The drain of transistor M12 is connected to the drain of transistor M10 and the source of M8.

OUT is the logical NOR of CTL_A and CTL_B. That is, OUT is logic high when both CTL_A and CTL_B are logic low, and OUT is logic low otherwise (i.e., when at least one of CTL_A and CTL_B are logic high). When both CTL_A and CTL_B are logic low, both transistors M8 and M10 are on, and transistor M9 is off. OUT is therefore pulled high through M8 and M10. When CTL_B is high, transistor M10 is off and transistor M11 is on thereby pulling OUT low. When CTL_A is high, transistor M8 is off and M9 is on thereby pulling OUT low. When both CTL_A and CTL_B are high, transistor M9 again is on (due to CTL_A being high), and OUT is pulled low.

M12 provides a DC bias to intermediate node N2 as CTL_B transitions from low to high. When CTL_B transitions from low to high, transistor M10 turns off and, absent transistor M12, the intermediate node N2 would float. However, when CTL_B becomes a logic high, M12 turns on thereby pulling intermediate node N1 low. As such transistor M12 functions in a similar fashion as M3A in the NAND gate implementation of FIG. 1. The examples of FIGS. 3, 5, 7, 8, and 10 in which the intermediate node within the NAND gate is pulled low to avoid the intermediate node floating can also be extended to a NOR gate. For example, a PMOS transistor such as M3B in FIG. 3 can be connected between VDD and intermediate node N1, with the gate of such transistor controlled by CTL_B. By way of an additional example, a capacitive device (e.g., CS1 in FIG. 5, or a drain-to-source connected transistor as in FIGS. 7 and 8) can be connected to the intermediate node N1 in FIG. 12.

Figure 13:
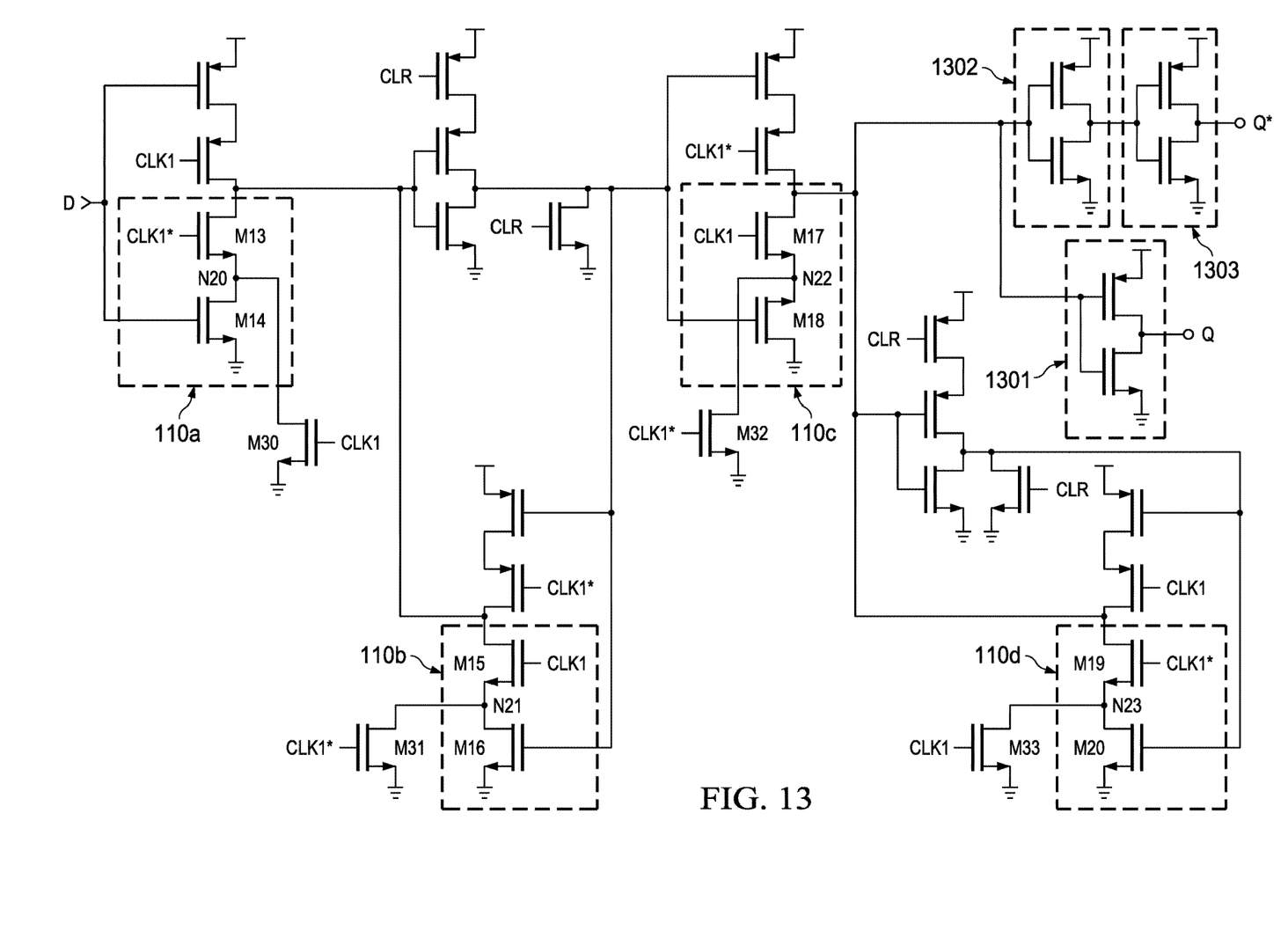
FIG. 13 shows an example of a flip-flop including multiple transistor stacks and transistors to provide a DC bias to intermediate nodes of the transistor stacks.

FIG. 13 shows an example of a D flip-flop that, in accordance with a clock (CLK1) latches the data on the D input on to the Q output. The Q output is provided by an inverter comprising transistor pair 1301, and the Q* output (Q* is the logic inverse of Q) is provided by the dual back-to-back inverters comprising transistor pair 1302 and 1303. Some of the transistor gates receive the CLK1 input, and other transistor gates receive CLK1* which is the inverse of CLK1. The D flip-flop in this example includes multiple transistors stacks including transistor stacks 110a, 110b, 110c, and 110d. Transistor stack 110a includes transistors M13 and M14 connected together at intermediate node N20. Transistor stack 110b includes transistors M15 and M16 connected together at intermediate node N21. Transistor stack 110c includes transistors M17 and M18 connected together at intermediate node N22. Transistor stack 110d includes transistors M19 and M20 connected together at intermediate node N23. Similar to the example of FIG. 1, a separate transistor is coupled to each intermediate node. Transistor M30 is coupled to node N20. Transistor M31 is coupled to node N21. Transistor M32 is coupled to node N22. Transistor M33 is coupled to node N23. Each of transistors M30-M33 is operative to bias the respective intermediate node to the ground potential as described above. The examples of FIGS. 3, 5, 7, 8, and 10 in which the intermediate node within the NAND gate is pulled low to avoid the intermediate node floating can also be extended to a flip-flop.

Figure 14:
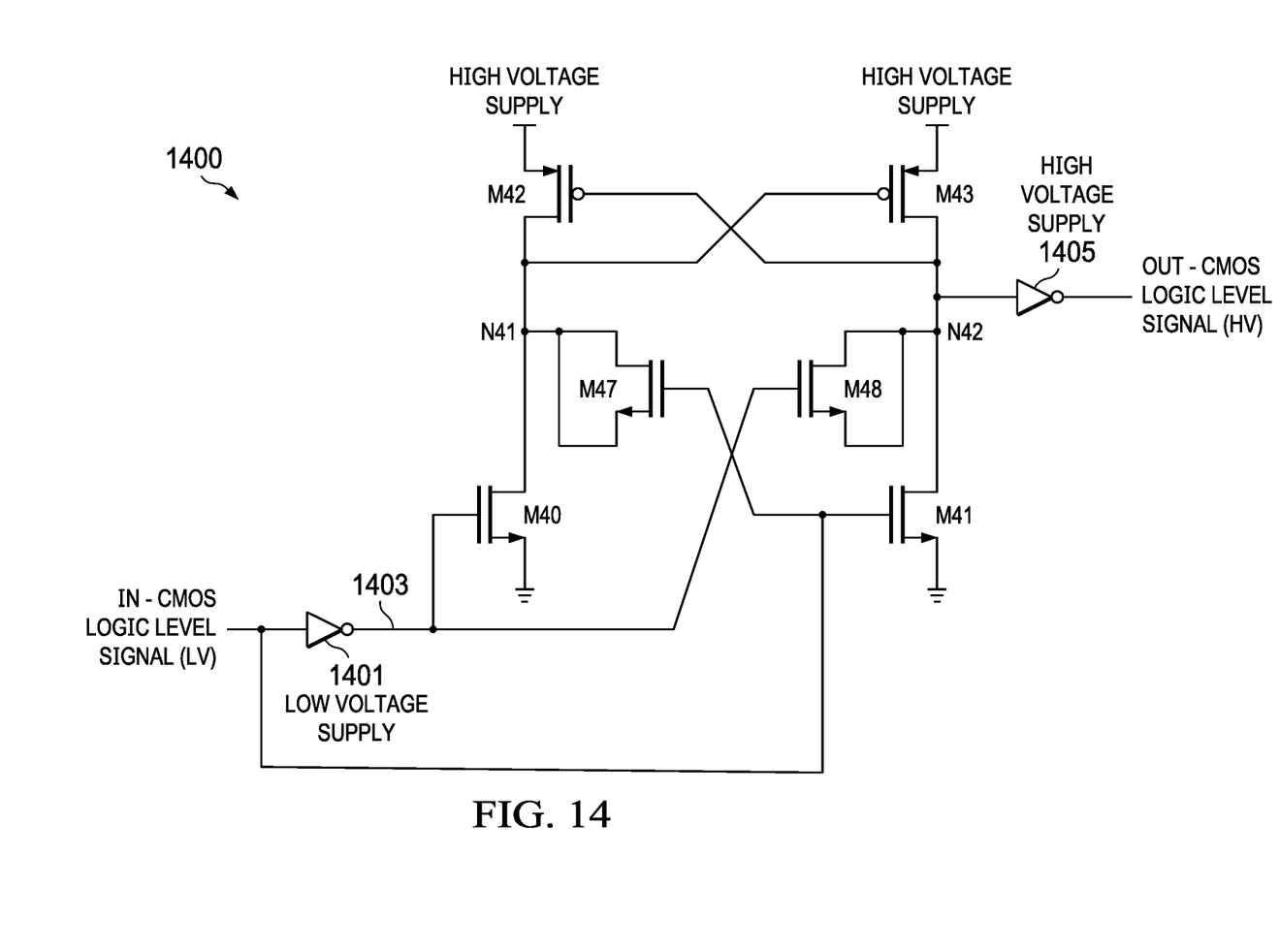
FIG. 14 shows an example of a level shifter and a component to provide a DC bias voltage to an intermediate node of the level shifter.

FIG. 14 shows an example of a level shifters 1400 to shift the voltage level of an input signal (IN) from one voltage domain to a different voltage as an output signal (OUT). The level shifter 1400 of FIG. 14 includes inverters 1401 and 1405, and transistors M40, M41, M42, M43, M47, and M48. In this example, M40 and M41 are NMOS transistors, and M42 and M43 are PMOS transistors. The gate of M41 is driven by the input signal (IN), and the gate of M42 is driven by the logical inverse of IN via inverter 1401. The inverter 1401 is powered by a supply voltage of one voltage domain. The sources of M42 and M43, as well as the power input to inverter 1405 are connected to a supply voltage of a different voltage domain. In this example, the supply voltage to inverter 1401 is a lower voltage domain (LV) than the supply voltage (HV) connected to transistors M42 and M43 and inverter 1405. The drain of M42 is connected to the drain of M40 at intermediate node N41, and the drain of M43 is connected to the drain of M41 at intermediate node N42. The gate of transistor M42 is connected to the drain of transistor M43, and the gate of M43 is connected to drain of transistor M42. When IN is a logic high within its LV voltage domain, the voltage on node N42 will be low, and then inverted to a logic high via inverter 1405, but in a different voltage domain (HV). When IN is low, OUT is also low.

Transistor M47 has its drain and source terminals connected together and to node N41. The gate of transistor M47 is connected to the gate of transistor M41. Similarly, transistor M48 has its drain and source terminals connected together and to node N42, and its gate connected to the gate of transistor M40. Transistors M47 and M48 function as capacitors to reduce the negative voltage on nodes N1 and N2. M47 and M48 can be implemented as NMOS transistors as shown, or as other types of transistors (e.g., PMOS transistors). As IN transitions from high to low, transistor M41 begins to turn off (with a falling input IN), and node N42 (absent transistor M48) is pulled low below ground due to the gate-to-drain capacitance of M41. The increase in the voltage on the output 1403 from inverter 1401 counteracts the drop in the voltage on node N42 due to the capacitance of transistor M48. A similar affect occurs on node N41 using transistor M47 as IN transitions from low to high.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

The invention claimed is:

1. A circuit comprising:
   a first transistor including a first load terminal;
   a second transistor including:
      a second load terminal directly coupled to the first load terminal of the first transistor; and
      a third load terminal;
   a third transistor including:
      a fourth load terminal coupled to a first reference terminal; and
      a fifth load terminal directly coupled to the third load terminal of the second transistor;
   a fourth transistor including:
      a sixth load terminal coupled to the first reference terminal; and
      a seventh load terminal coupled to the third load terminal of the second transistor and to the fifth load terminal of the third transistor;
   a fifth transistor including:
      an eighth load terminal coupled to the first reference terminal; and
      a ninth load terminal coupled to the first load terminal of the first transistor and the second load terminal of the second transistor; and
   a capacitive circuit element including a first capacitive terminal coupled to the first load terminal of the first transistor and coupled to the second load terminal of the second transistor,
   wherein the capacitive circuit element further includes a second capacitive terminal coupled to the first reference terminal.

2. The circuit of claim 1,
   wherein the first transistor and the second transistor are p-type metal oxide semiconductor (PMOS) transistors, and
   wherein the third transistor and the fourth transistor are n-type metal oxide semiconductor (NMOS) transistors.

3. The circuit of claim 1, wherein the first transistor and the second transistor form a transistor stack.

4. The circuit of claim 1, wherein the seventh load terminal is directly coupled to the third load terminal of the second transistor.

5. The circuit of claim 1,
   wherein the first transistor includes a first control terminal configured to receive a first control signal,
   wherein the second transistor includes a second control terminal configured to receive a second control signal,
   wherein the third transistor includes a third control terminal configured to receive the second control signal, and
   wherein the fourth transistor includes a fourth control terminal configured to receive the first control signal.

6. The circuit of claim 5,
   wherein the third load terminal of the second transistor, the fifth load terminal of the third transistor, and the seventh load terminal of the fourth transistor are coupled to an output terminal, and
   wherein a signal at the output terminal is a logical NOR of the first control signal and the second control signal.

7. The circuit of claim 1,
   wherein the first transistor includes a first control terminal,
   wherein the fourth transistor includes a fourth control terminal coupled to the first control terminal.

8. The circuit of claim 1,
wherein the second transistor includes a second control terminal, and
wherein the third transistor includes a third control terminal coupled to the second control terminal.

9. The circuit of claim 1, wherein the ninth load terminal is coupled to:
the first load terminal of the first transistor;
the second load terminal of the second transistor; and
the first capacitive terminal of the capacitive circuit element.

10. The circuit of claim 1,
wherein the first transistor includes a first control terminal,
wherein the fourth transistor includes a fourth control terminal,
wherein the fifth transistor includes a fifth control terminal coupled to the first control terminal and the fourth control terminal.

11. The circuit of claim 10,
wherein the second transistor includes a second control terminal, and
wherein the third transistor includes a third control terminal coupled to the second control terminal.

12. The circuit of claim 1, wherein the eighth load terminal is coupled to the fourth load terminal and the sixth load terminal.

13. The circuit of claim 1, wherein the first transistor further includes a tenth load terminal coupled to a second reference terminal.

14. A circuit comprising:
a first transistor including:
 a first load terminal;
 a second load terminal directly coupled to a first reference terminal; and
 a first control terminal;
a second transistor including:
 a third load terminal;
 a fourth load terminal directly coupled to the first reference terminal; and
 a second control terminal;
a third transistor including:
 a fifth load terminal directly coupled to the first load terminal; and
 a third control terminal coupled to the third load terminal;
a fourth transistor including:
 a sixth load terminal directly coupled to the third load terminal and to the third control terminal; and
 a fourth control terminal coupled to the first load terminal and to the fifth load terminal;
a first inverter including:
 an input coupled to the second control terminal; and
 an output coupled to the first control terminal;
a first capacitive circuit element including:
 a first capacitive terminal directly coupled to the first load terminal, to the fifth load terminal, and to the fourth control terminal; and
 a second capacitive terminal coupled to the second control terminal and to the input of the first inverter; and
a second capacitive circuit element including:
 a third capacitive terminal directly coupled to the third load terminal, to the sixth load terminal, and to the third control terminal; and
 a fourth capacitive terminal coupled to the first control terminal and to the output of the first inverter.

15. The circuit of claim 14,
wherein the third transistor includes a seventh load terminal coupled to a second reference terminal, and
wherein the fourth transistor includes an eighth load terminal coupled to the second reference terminal.

16. The circuit of claim 14, further comprising a second inverter including an input coupled to the third load terminal, to the sixth load terminal, to the third control terminal, and to the third capacitive terminal.

17. The circuit of claim 15,
wherein the first capacitive circuit element is a fifth transistor including:
 a ninth load terminal coupled to the first capacitive terminal; and
 a tenth load terminal coupled to the eighth load terminal, and
wherein the second capacitive circuit element is a sixth transistor including:
 an eleventh load terminal coupled to the third capacitive terminal; and
 a twelfth load terminal coupled to the eleventh load terminal.

18. A circuit comprising:
a first p-type metal oxide semiconductor (PMOS) transistor including:
 a first load terminal; and
 a first control terminal;
a second PMOS transistor including:
 a second load terminal directly coupled to the first load terminal of the first PMOS transistor;
 a third load terminal; and
 a second control terminal;
a first NMOS transistor including:
 a fourth load terminal coupled to a first reference terminal;
 a fifth load terminal directly coupled to the third load terminal of the second PMOS transistor; and
 a third control terminal coupled to the second control terminal;
a second NMOS transistor including:
 a sixth load terminal coupled to the first reference terminal;
 a seventh load terminal directly coupled to the third load terminal of the second PMOS transistor and to the fifth load terminal of the first NMOS transistor; and
 a fourth control terminal coupled to the first control terminal;
a third NMOS transistor including:
 an eighth load terminal coupled to the first reference terminal;
 a ninth load terminal coupled to the first load terminal of the first PMOS transistor and the second load terminal of the second PMOS transistor; and
 a fifth control terminal coupled to the first control terminal; and
a capacitive circuit element including a first capacitive terminal coupled to the first load terminal of the first PMOS transistor and coupled to the second load terminal of the second PMOS transistor,
wherein the capacitive circuit element further includes a second capacitive terminal coupled to the first reference terminal.

19. The circuit of claim 14,
wherein the first transistor includes a first n-type metal oxide semiconductor (NMOS) transistor, wherein the second transistor includes a second NMOS transistor, wherein the third transistor includes a first p-type metal oxide semiconductor (PMOS) transistor, and wherein the fourth transistor includes a second PMOS transistor.

20. The circuit of claim 19, wherein the third transistor includes a seventh load terminal coupled to a second reference terminal, and wherein the fourth transistor includes an eighth load terminal coupled to the second reference terminal.

\* \* \* \* \*